(12) United States Patent
Mukae

(10) Patent No.: US 8,018,123 B2
(45) Date of Patent: Sep. 13, 2011

(54) ULTRASONIC ACTUATOR

(75) Inventor: Hideaki Mukae, Hyogo (JP)

(73) Assignee: Panasonic Corporation, Osaka (JP)

( * ) Notice: Subject to any disclaimer, the term of this patent is extended or adjusted under 35 U.S.C. 154(b) by 183 days.

(21) Appl. No.: 12/469,082

(22) Filed: May 20, 2009

(65) Prior Publication Data

US 2009/0224631 A1   Sep. 10, 2009

Related U.S. Application Data

(63) Continuation of application No. PCT/JP2008/051563, filed on Jan. 31, 2008.

(30) Foreign Application Priority Data

Feb. 2, 2007   (JP) ................................. 2007-024439

(51) Int. Cl.
   *H01L 41/08*   (2006.01)
(52) U.S. Cl. ..................... 310/317; 310/323.01; 310/345
(58) Field of Classification Search .................. 310/328, 310/311, 323.01–323.21, 316.01, 316.02, 310/348, 330, 345, 317; *H02N 2/00; H01L 41/08*
   See application file for complete search history.

(56) References Cited

U.S. PATENT DOCUMENTS

| | | | |
|---|---|---|---|
| 5,136,200 A | 8/1992 | Takizawa et al. | |
| 5,191,688 A | 3/1993 | Takizawa et al. | |
| 5,416,375 A | 5/1995 | Funakubo et al. | |
| 5,453,653 A | 9/1995 | Zumeris | |
| 5,616,980 A | 4/1997 | Zumeris | |
| 5,682,076 A | 10/1997 | Zumeris | |
| 5,714,833 A | 2/1998 | Zumeris | |
| 5,777,423 A | 7/1998 | Zumeris | |
| 5,877,579 A | 3/1999 | Zumeris | |
| 6,037,702 A | 3/2000 | Tamai | |
| 6,064,140 A | 5/2000 | Zumeris | |
| 6,198,201 B1 | 3/2001 | Okumura | |

(Continued)

FOREIGN PATENT DOCUMENTS

JP   3-195379   8/1991

(Continued)

OTHER PUBLICATIONS

Reconsideration Report for corresponding Japanese Patent Application No. 2008-291801, mailed Dec. 8, 2009 (with translation).

(Continued)

*Primary Examiner* — Thomas Dougherty
*Assistant Examiner* — Karen B Addison
(74) *Attorney, Agent, or Firm* — Renner, Otto, Boisselle & Sklar, LLP

(57) ABSTRACT

An ultrasonic actuator (2) includes an actuator body (3) generating a driving force, a case (4) containing the actuator body (3), and support rubbers (51) placed between the actuator body (3) and the case (4) to elastically support the actuator body (3) at both sides of the actuator body in a supporting direction. The case (4) includes a first case (8) having an opening at a position where one of the support members (51) is placed and a second case (9) coupled to the first case (8) to cover the opening in the first case (8). The support rubbers (51) are compressed as the second case (9) is coupled to the first case (8) and elastically support the actuator body (3) in the compressed state.

23 Claims, 11 Drawing Sheets

U.S. PATENT DOCUMENTS

| | | | |
|---|---|---|---|
| 6,218,767 | B1 | 4/2001 | Akada et al. |
| 6,897,598 | B2 * | 5/2005 | Kato et al. .................. 310/317 |
| 7,215,062 | B1 | 5/2007 | Iino et al. ................ 310/323.02 |
| 7,545,085 | B2 * | 6/2009 | Adachi .......................... 310/365 |
| 7,671,516 | B2 * | 3/2010 | Adachi et al. ............ 310/323.01 |
| 7,898,416 | B2 * | 3/2011 | Fago et al. ................. 340/572.1 |
| 2007/0029900 | A1 | 2/2007 | Kang et al. |
| 2008/0278035 | A1 * | 11/2008 | Higashionji et al. .......... 310/330 |
| 2009/0072665 | A1 | 3/2009 | Adachi et al. |

FOREIGN PATENT DOCUMENTS

| | | |
|---|---|---|
| JP | 04-055714 | 2/1992 |
| JP | 04-091675 | 3/1992 |
| JP | 6-105571 | 4/1994 |
| JP | 08-237971 | 9/1996 |
| JP | 3037197 | 2/1997 |
| JP | 09-140167 | 5/1997 |
| JP | 09-201080 | 7/1997 |
| JP | 2000-58934 | 2/2000 |
| JP | 2004-328816 | 11/2004 |
| JP | 2005-351300 | 12/2005 |
| JP | 2006-271169 | 10/2006 |
| JP | 2008-278719 | 11/2008 |
| WO | 2007/066633 | 6/2007 |

OTHER PUBLICATIONS

Notice of Release of Reconsideration Before Appeal for corresponding Japanese Patent Application No. 2008-291801, mailed Dec. 8, 2009 (with translation).

International Search Report and Written Opinion for corresponding Application No. PCT/JP2008/051563 mailed Apr. 22, 2008.

Form PCT/ISA/237.

Notice for Reasons for Rejection in corresponding Japanese Application No. 2008-291801 dated Mar. 17, 2009, with English translation.

Notice for Reasons for Rejection in corresponding Japanese Application No. 2008-291801 dated Dec. 9, 2008, with English translation.

Notice of Reasons for Rejection for corresponding Japanese Patent Application No. 2008-291801, mailed Jul. 13, 2010 with English translation.

* cited by examiner

ULTRASONIC ACTUATOR

CROSS-REFERENCE TO RELATED APPLICATION

This application is a continuation of PCT International Patent Application No. PCT/JP2008/051563, filed on Jan. 31, 2008, which claims priority of Japanese Patent Application No. 2007-024439, filed on Feb. 2, 2007, the entire contents of which are expressly incorporated by reference herein.

BACKGROUND

The present invention relates to an ultrasonic actuator which generates a driving force.

In recent years, as an example of ultrasonic actuators of this kind, an ultrasonic actuator disclosed by Patent Document 1 has been known. This ultrasonic actuator includes an actuator body including a piezoelectric element having four electrodes provided at different positions. AC voltages having different phases are applied to two electrode pairs of the actuator body, each of which includes two electrodes diagonally arranged, so as to harmonically induce longitudinal and bending vibrations, thereby generating a driving force.

According to Patent Document 1, the actuator body is elastically supported on a base member so that the vibrations of the actuator body are not hindered. For example, Patent Document 1 discloses a structure in which the actuator body is elastically supported in a case serving as the base member.
[Patent Document 1] Published Japanese Patent Application No. H8-237971

SUMMARY

However, Patent Document 1 fails to disclose a specific structure for elastically supporting the actuator body in the case.

For example, a possible structure for supporting the actuator body contained in the case is as follows. An opening is formed in the case so that the actuator body is inserted through it and the actuator body is placed in the case through the opening. Then, a support member for elastically supporting the actuator body is inserted between the case and the actuator body. In this structure, the support member has to be inserted between the case and the actuator body in a compressed state. Therefore, a certain force is required for assembling the structure. Further, there is difficulty in placing the support member in a desired position between the actuator body and the case.

An object of the present invention is to improve the ease of assembly of the ultrasonic actuator and place the support member between the actuator body and the case with precision.

To achieve the object, the case for containing the actuator body and the support is separable into pieces so that the support member is compressed to elastically support the actuator body when the pieces of the case are coupled.

More specifically, the foregoing structure is directed to an ultrasonic actuator which generates a driving force. The ultrasonic actuator includes: an actuator body having a piezoelectric element and generating a driving force by vibration; a case containing the actuator body; and at least two support members placed between the actuator body and the case to elastically support the actuator body at both sides of the actuator body in a supporting direction, wherein the case includes a first case provided with an opening at a position where one of the support members is placed and a second case coupled to the first case to cover the opening in the first case, and the support members are compressed when the second case is coupled to the first case and elastically support the actuator body in the compressed state.

The support members are compressed as the second case is coupled to the first case. This eliminates the need to perform a complicated process of inserting the support members kept in the compressed state between the actuator body and the case. Therefore, the ease of assembly of the ultrasonic actuator is improved. Further, the positions of the support members are not determined with the support members kept in the compressed state, but determined before the second case is coupled to the first case, i.e., before the support members are compressed. Therefore, the support members are placed between the actuator body and the case with precision. Thus, the ultrasonic actuator is allowed to achieve a desired performance.

EXPLANATION OF REFERENCE NUMERALS

Figure 1:
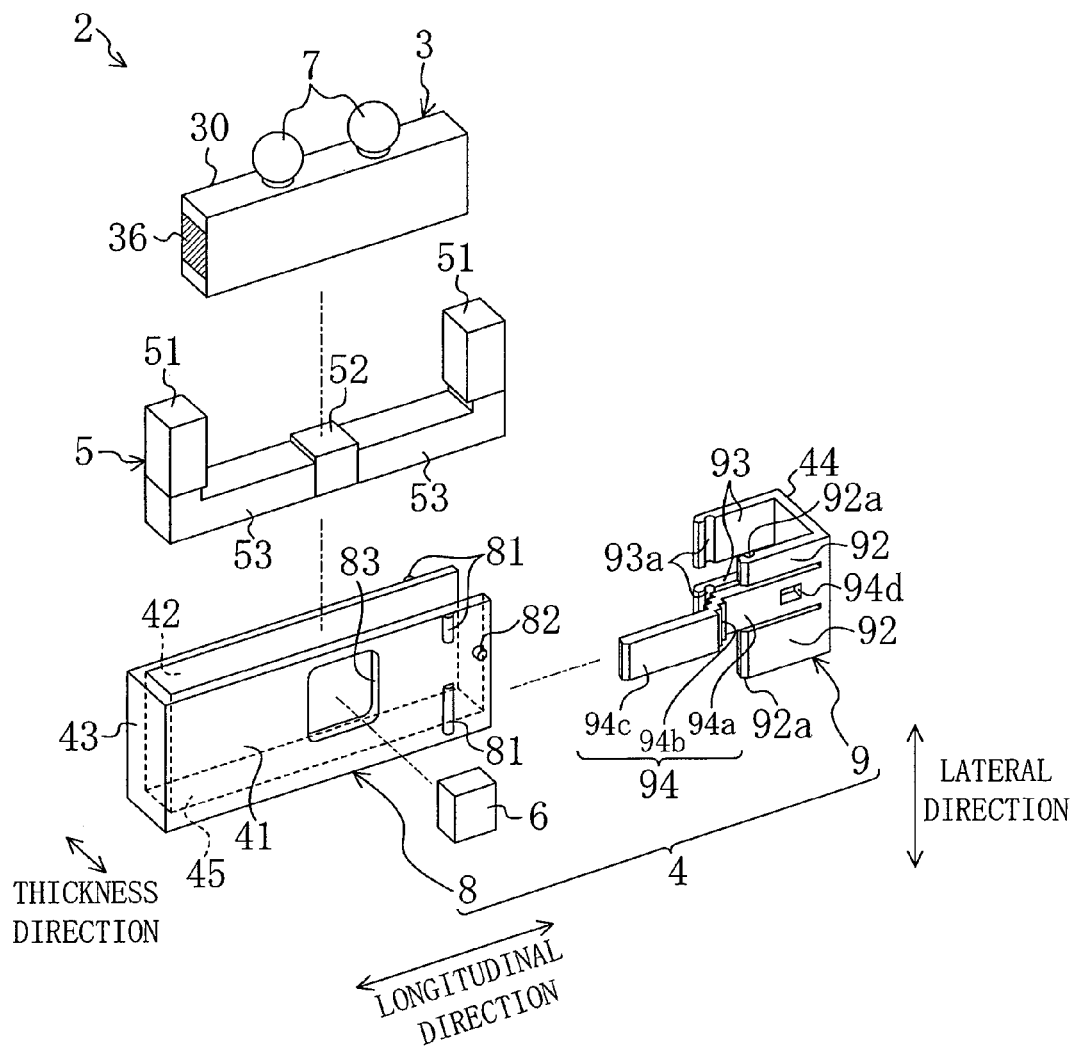
FIG. 1 is an exploded perspective view of an ultrasonic actuator according to Embodiment 1.

3 Actuator body
30 Piezoelectric element
35, 36, 37 External electrode (on-element electrode)
4 Case
46, 47, 48 Electrode (on-case electrode)
46a, 47a, 48a Terminal electrode (power supply electrode)
51 Support rubber (support member)
52 Bias rubber (bias member)
53 Connecting rubber (connecting member)
6 Attitude holding rubber (attitude holding member)
7 Driver element
8 First case
81 Engagement bump (counter engagement part)
82 Engagement protrusion (engagement protrusion for pressing)

83 Opening
9 Second case
92a, 93a Engagement hook
94 Pressing member
94d Engagement hole (engagement hole for pressing)
204 Case
208 First case
209 Second case
254 Flexible board (connecting member)
255a, 255b, 255c Terminal electrode (power supply electrode)
304 Case
308 First case
309 Second case
354 Flexible board (connecting member)
355a, 355b, 355c Terminal electrode (power supply electrode)

DETAILED DESCRIPTION OF THE PREFERRED EMBODIMENTS

Hereinafter, embodiments of the present invention will be described with reference to the drawings.

Embodiment 1

Figure 3:
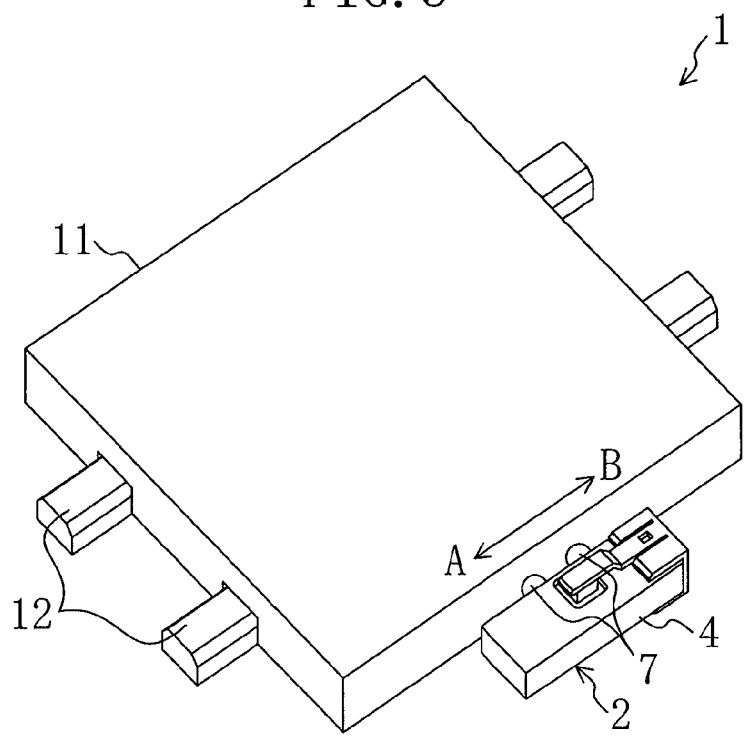
FIG. 3 is a perspective view of a drive unit.

A drive unit 1 according to Embodiment 1 of the present invention includes a stage 11, rails 12 and an ultrasonic actuator 2 as shown in FIG. 3, and a base and a control unit not shown.

The rails 12 are fixed to the base to be parallel to each other. The stage 11 is a plate-like member which is substantially square when viewed in plan. The stage 11 is slidably attached to the rails 12 with a pair of opposing side end faces being parallel to the rails 12. The ultrasonic actuator 2 is attached to one of the pair of opposing side end faces of the stage 11. The ultrasonic actuator 2 is fixed to the base and connected to the control unit. In response to a drive signal sent from the control unit, the ultrasonic actuator 2 drives the stage 11 to move along the longitudinal direction of the rails 12, i.e., to move in the directions of arrows A and B indicated in FIG. 3. The stage 11 corresponds to a drive target.

Figure 2:
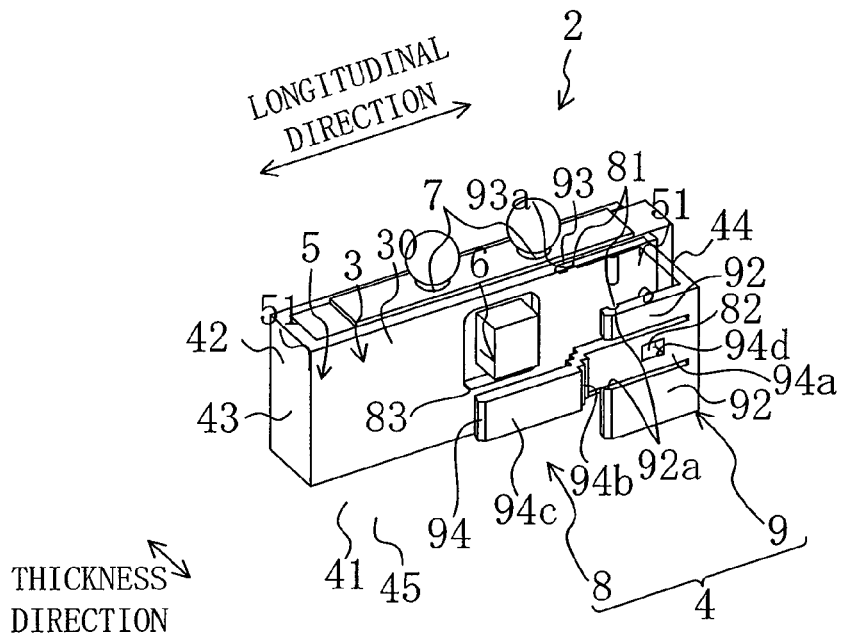
FIG. 2 is a perspective view of the ultrasonic actuator.

As shown in FIGS. 1 and 2, the ultrasonic actuator 2 includes an actuator body 3 which generates a vibration, a case 4 containing the actuator body 3, a support unit 5 placed between the actuator body 3 and the case 4 to elastically support the actuator body 3, and an attitude holding rubber 6 for holding the attitude of the actuator body 3.

The actuator body 3 includes a piezoelectric element 30 and two driver elements 7 fixed to the piezoelectric element 30.

The piezoelectric element 30 has a substantially rectangular parallelepiped shape including a pair of principal surfaces each having a substantially rectangular shape and being opposed to each other, a pair of long side surfaces each being perpendicular to each of the principal surfaces, extending along long sides of the principal surfaces and being opposed to each other, and a pair of short side surfaces each being perpendicular to each of the principal surfaces and the long side surfaces and extending along short sides of the principal surfaces.

Figure 4:
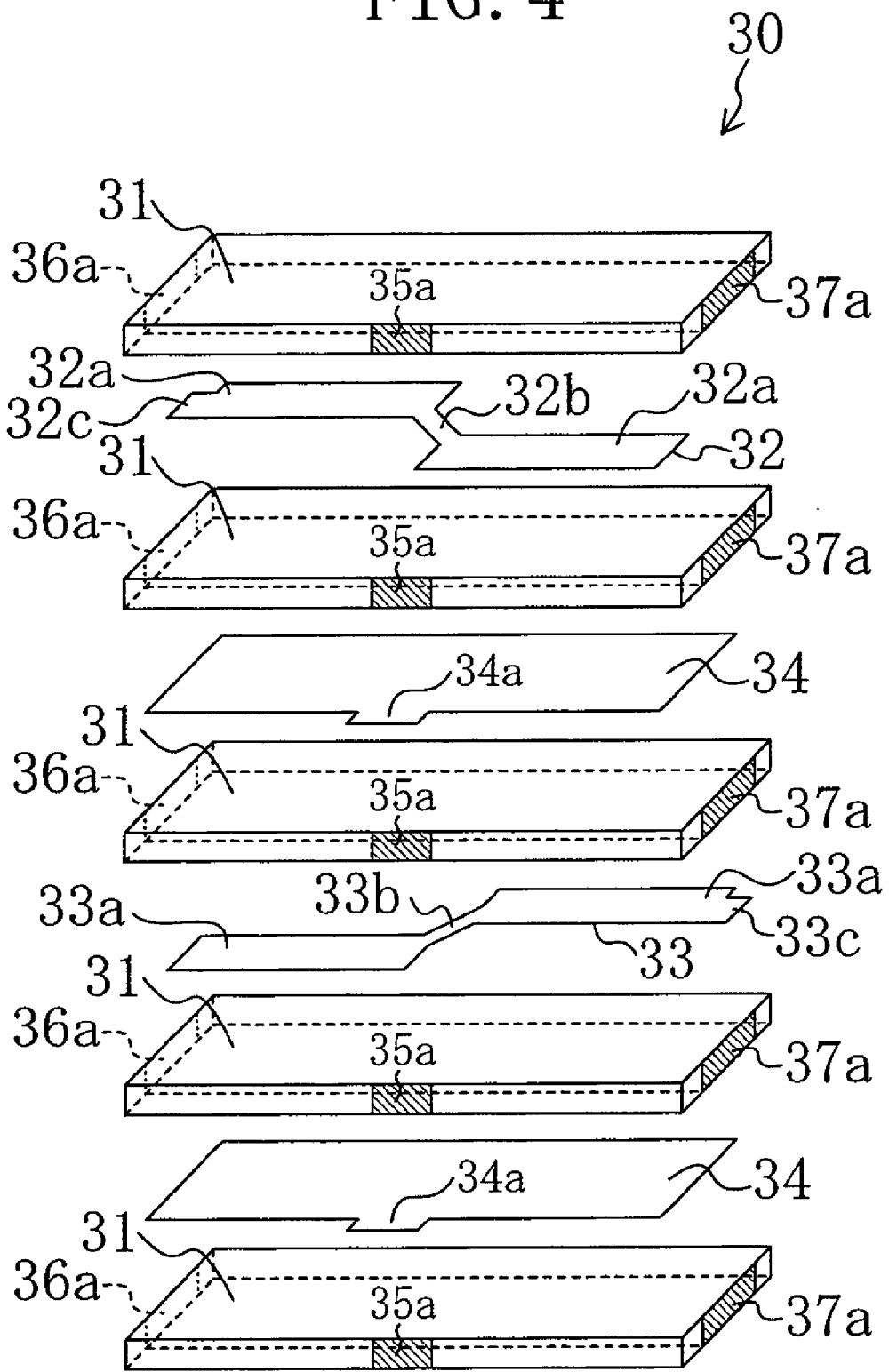
FIG. 4 is an exploded perspective view of a piezoelectric element.

As shown in FIG. 4, the piezoelectric element 30 includes five piezoelectric element layers 31 and four internal electrode layers 32, 33, 34 and 34 which are alternately stacked. Specifically, the internal electrode layers 32, 33, 34 and 34 are, respectively, formed of a first power supply electrode layer 32, a common electrode layer 34, a second power supply electrode layer 33 and another common electrode layer 34 which are alternately provided in a stacking direction with each of the piezoelectric element layers 31 interposed between any two of the internal electrode layers. Each of the first power supply electrode layer 32, the second power supply electrode layer 33 and the common electrode layers 34 is printed on an associated one of the piezoelectric element layers 31.

Each of the piezoelectric element layers 31 is an insulation layer, for example, formed of a ceramic material such as lead zirconate titanate and has a substantially rectangular parallelepiped shape including a pair of principal surfaces, a pair of long side surfaces and a pair of short side surfaces in the same manner as the piezoelectric element 30. Moreover, an external electrode 35a is formed in center part of a long side surface in the longitudinal direction, in which the driver elements 7 are not provided, an external electrode 36a is formed in center part of one short side surface in the lateral direction, and an external electrode 37a is formed in center part of the other short side surface in the lateral direction.

Each of the common electrode layers 34 has a substantially rectangular shape provided substantially on an entire principal surface of an associated one of the piezoelectric element layers 31. Moreover, a lead electrode 34a is formed in one long side portion of each of the common electrode layers 34 so as to extend from center part of the common electrode layer 34 in the longitudinal direction thereof to the external electrode 35a of the piezoelectric element layer 31.

Suppose that the principle surface of each of the piezoelectric element layer 31 is divided in four quadrants, i.e., two areas in the longitudinal direction and two areas in the lateral direction. The first power supply electrode layer 32 includes first electrodes 32a respectively formed in one pair of the areas located in one diagonal direction of the principal surface, and a conductive electrode 32b for connecting the first electrodes 32a to bring them into electrical conduction. Each first electrode 32a is an electrode having a substantially rectangular shape and overlaps with the common electrode layers 34 when viewed in the stacking direction. That is, each first electrode 32a is opposed to an associated one of the common electrode layers 34 with an associated one of the piezoelectric element layers 31 interposed therebetween. One of the first electrodes 32a is provided with a lead electrode 32c extending to the external electrode 36a of the piezoelectric element layer 31.

The second power supply electrode layer 33 includes a pair of second electrodes 33a respectively formed in the other pair of the areas located in the other diagonal direction of the principal surface, and a conductive electrode 33b for connecting the second electrodes 33a to bring them into electrical conduction. Each second electrode 33a is an electrode having a substantially rectangular shape and overlaps with the common electrode layers 34 when viewed in the stacking direction. That is, each second electrode 33a is opposed to an associated one of the common electrode layers 34 with an associated one of the piezoelectric element layers 31 interposed therebetween. One of the second electrodes 33a is provided with a lead electrode 33c extending to the external electrode 37a of the piezoelectric element layer 31.

Figure 8:
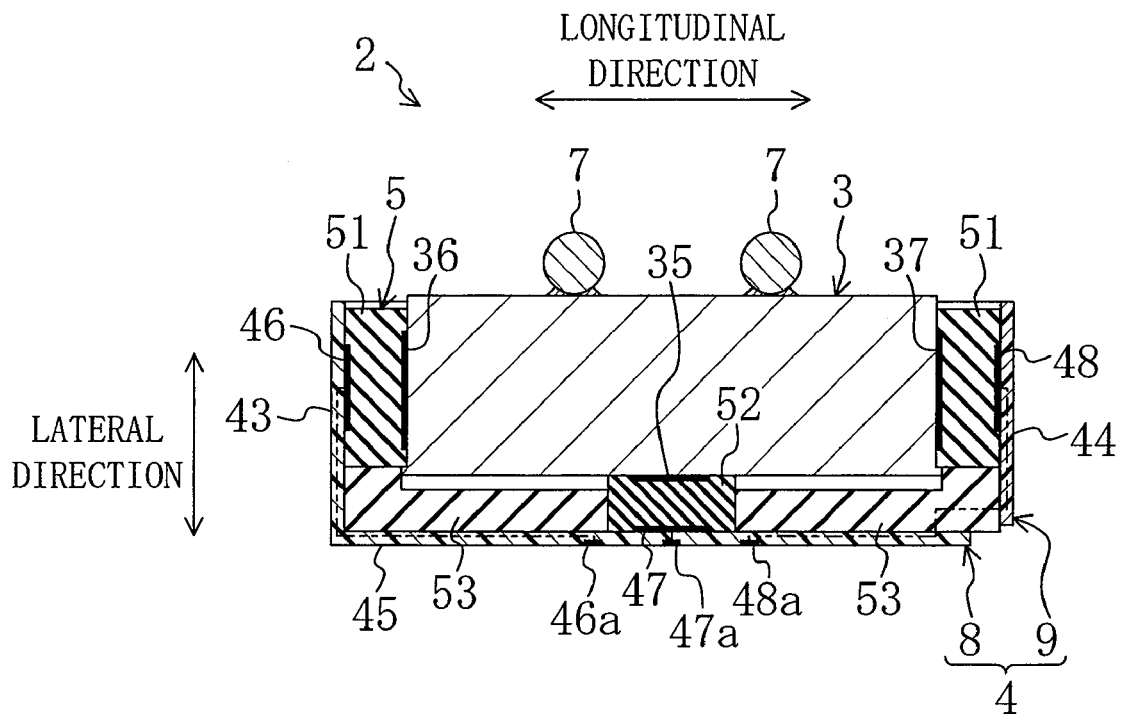
FIG. 8 is a sectional view of the ultrasonic actuator.

In the piezoelectric element 30 formed by alternately stacking the piezoelectric element layers 31 and the internal electrode layers 32, 34, 33 and 34, the respective external electrodes 35a of the piezoelectric element layers 31 align in center part of one long side surface thereof in the longitudinal direction, thereby forming an integrated external electrode 35 (see FIG. 8). The lead electrodes 34a provided to the common electrode layers 34 are electrically connected to the integrated external electrode 35. In the same manner, the respective external electrodes 36a of the piezoelectric element layers 31 align in center part of one short side surface of the piezoelectric element 30 in the lateral direction, thereby forming an integrated external electrode 36 (see FIGS. 1 and 8). The respective external electrode 37a of the piezoelectric element layers 31 align in the center part of the other short side surface of the piezoelectric element 30 in the lateral direction, thereby forming an integrated external electrode 37 (see FIG. 8). The lead electrode 32c of the first power supply electrode layer 32 is electrically connected to the external electrode 36, and the lead electrode 33c of the second power supply electrode layer 33 is electrically connected to the external electrode 37. The external electrodes 35, 36 and 37 function as on-element electrodes.

On the other long side surface of the piezoelectric element 30 in which the external electrodes 35 are not provided, the driver elements 7 are provided to align in the longitudinal direction so as to be spaced apart from each other. The driver elements 7 are provided in parts of the long side surface located at a distance of 30% to 35% of the full length of the long side surface inwardly from both edges in the longitudinal direction, respectively. Each of the driver elements 7 has a substantially spherical shape.

Figure 5:
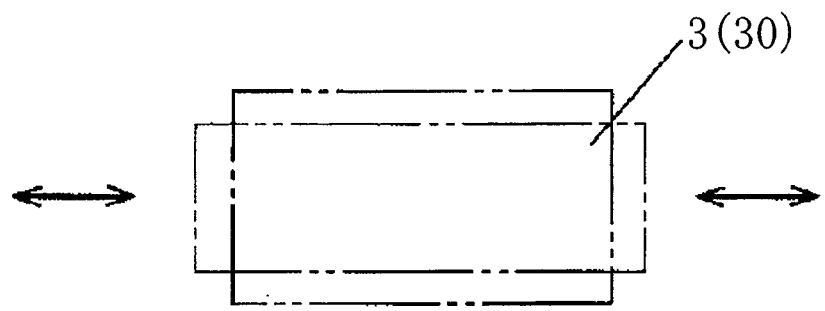
FIG. 5 is a conceptual view illustrating the displacement of the piezoelectric element in the first mode of stretching vibration.
Figure 6:
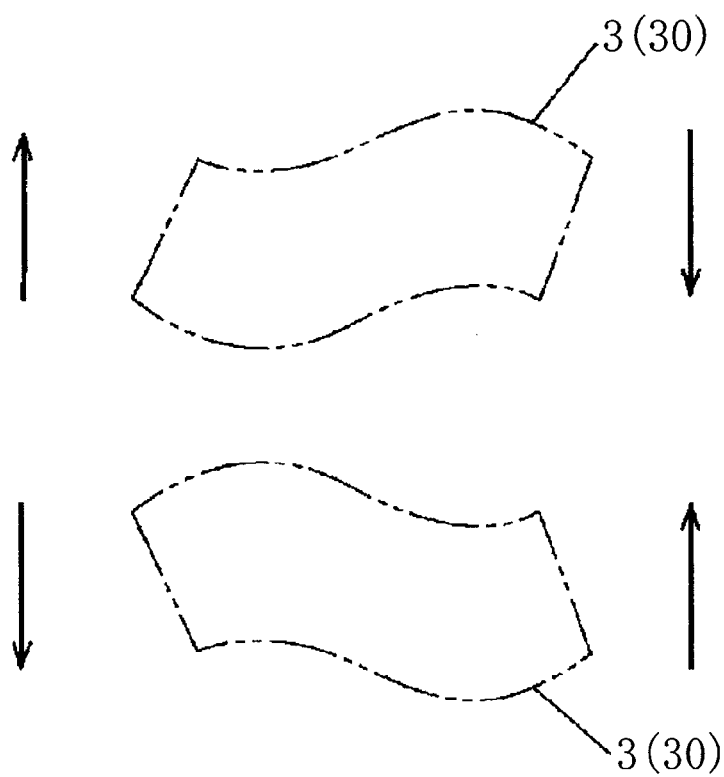
FIG. 6 is a conceptual view illustrating the displacement of the piezoelectric element in the second mode of bending vibration.

In the actuator body 3 thus configured, the external electrode 35 is connected to electrical ground. An AC voltage of a predetermined frequency is applied to the external electrode 36 and an AC voltage having a phase shifted by 90° or −90° from the AC voltage applied to the external electrode 36 is applied to the external electrode 37. This induces the first mode of longitudinal vibration (so-called expansion/contraction vibration) shown in FIG. 5 and the second mode of bending vibration shown in FIG. 6.

Respective resonance frequencies of longitudinal vibration and bending vibration are determined by a material, a shape and the like of the piezoelectric element 30. Furthermore, the resonance frequencies both are influenced by force supporting the piezoelectric element 30 and a position where the piezoelectric element 30 is supported. Taking this into consideration, the resonance frequencies are made to substantially match each other. by applying voltages having a frequency around the resonance frequencies, the first mode of longitudinal vibration and the second mode of bending vibration are induced harmonically in the piezoelectric element 30. Thus, the shape of the piezoelectric element 30 is changed in the order shown in FIGS. 7A, 7B, 7C and 7D.

Figure 7:
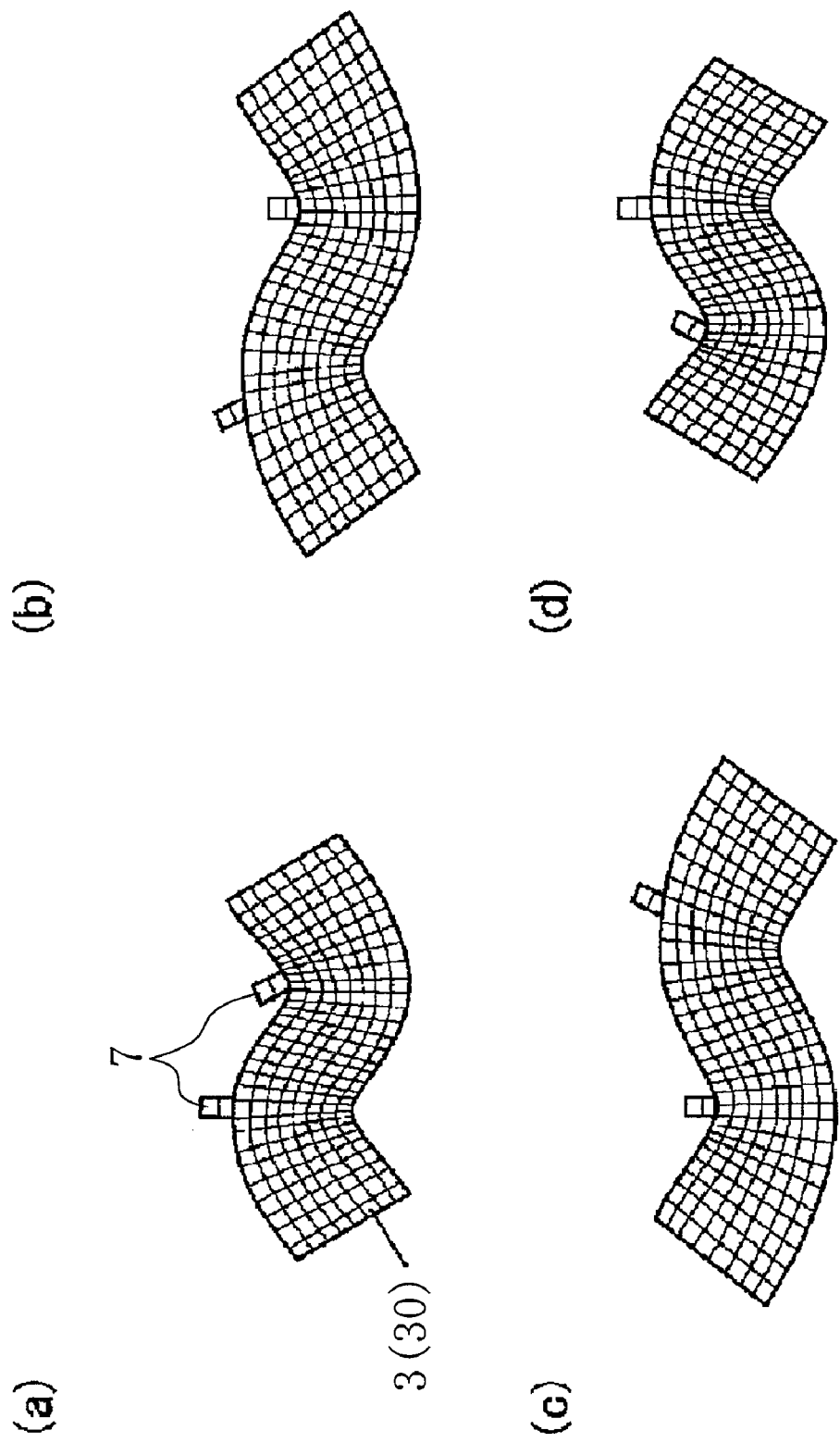
FIGS. 7A to 7D are conceptual views illustrating the movement of the piezoelectric element.

As a result, each of the driver elements 7 provided to the piezoelectric element 30 makes a substantially elliptical motion in a plane parallel to the page surface of FIG. 7. According to the elliptical motion, the driver elements 7 output a driving force in the driving direction corresponding to the longitudinal direction of the piezoelectric element 30 (in the directions of arrows A and B indicated in FIG. 3).

The case 4 has a substantially rectangular parallelepiped box shape corresponding to the piezoelectric element 30. The case 4 includes a pair of substantially rectangular principal wall portions 41 and 42 parallel to the principle surfaces of the piezoelectric element 30, a first short side wall portion 43 provided between the short sides of the principal wall portions 41 and 42 at one end of the principal wall portions 41 and 42 in the longitudinal direction (the left end in FIG. 1), a second short side wall portion 44 provided between the other short sides of the principal wall portions 41 and 42 at the other end of the principal wall portions 41 and 42 in the longitudinal direction (the right end in FIG. 1), and a long side wall portion 45 provided between the long sides of the principal wall portions 41 and 42 at one end of the principal wall portions 41 and 42 in the lateral direction (the lower end in FIG. 1). That is, the case 4 does not have a wall portion between the other long sides of the principal wall portions 41 and 42 at the other end of the principal wall portions 41 and 42 in the lateral direction (the upper end in FIG. 1), i.e., a wall portion corresponding to the long side surface of the piezoelectric element 30 on which the driver elements 7 are formed. The case 4 is open at the other end of the principal wall portions 41 and 42 in the lateral direction. The case 4 is a separable case including a first case 8 and a second case 9.

The first case 8 includes the principal wall portions 41 and 42, the first short side wall portion 43 and the long side wall portion 45 appropriately joined substantially in the form of a box open at the other end of the principal wall portions 41 and 42 in the longitudinal direction and the other end of the principal wall portions 41 and 42 in the lateral direction.

On each of the outer surfaces of the principal wall portions 41 and 42, two engagement bumps 81 protruding outwardly from the outer surface in the thickness direction of the piezoelectric element 30 (normal direction of the principal wall portions) are provided at positions close to the other end (open end) of the principal wall portions 41 and 42 in the longitudinal direction (on the principal wall portion 42 only one engagement bump is shown). The engagement bumps 81 are linear-shaped and extend in the lateral direction, respectively, and are aligned in a straight line to be spaced from each other in the lateral direction. The engagement bumps 81 function as counter engagement parts.

On the outer surface of one of the principal wall portions 41 and 42 at one end in the thickness direction, i.e., on the outer surface of the principal wall portion 41, an engagement protrusion 82 protruding outwardly from the outer surface in the thickness direction is provided at a position closer to the other end of the principal wall portion 41 in the longitudinal direction than the engagement bumps 81. The engagement protrusion 82 is located between the two engagement bumps 81 in the lateral direction. The engagement protrusion 82 functions as an engagement protrusion for pressing.

Further, a substantially square-shaped opening 83 is formed almost in the center of the principal wall portion 41 to place the attitude holding rubber 6 therein.

The second case 9 includes the second short side wall portion 44. The second case 9 has two engagement arms 92 and two engagement arms 93 extending to sandwich the principal wall portions 41 and 42 of the first case 8 in the thickness direction. The second case 9 is coupled to the first case 8 so as to cover the opening at the other end of the first case 8 in the longitudinal direction.

The engagement arms 92 are arranged at one end of the second short side wall portion 44 in the thickness direction to be spaced from each other in the lateral direction and extend from the one end of the second short side wall portion 44 toward the one end of the principal wall portion in the longitudinal direction. The engagement arms 93 are arranged at the other end of the second short side wall portion 44 in the thickness direction to be spaced from each other in the lateral direction and extend from the other end of the second short side wall portion 44 toward the one end of the principal wall portion in the longitudinal direction. The distance between the engagement arms 92 and the engagement arms 93 in the thickness direction is substantially the same as or slightly larger than the dimension of the first case 8 in the thickness direction. On the inside of the tip ends of the engagement arms 92 and 93, engagement hooks 92a and 93a which are engaged with the engagement bumps 81 of the first case 8, respectively, when the second case 9 is coupled to the first case 8, are provided. The engagement hooks 92a and 93b function as engagement parts.

A pressing member 94 for pressing the attitude holding rubber 6 from the one end to the other end in the thickness direction is provided between the engagement arms 92 at the one end of the second short side wall portion 44 in the thickness direction. The pressing member 94 includes a lower portion 94a extending from the one end of the second short side wall portion 44 in the thickness direction toward the one end of the principal wall portion in the longitudinal direction, an upper portion 94c located at the tip end of the lower portion 94a but spaced from the lower portion 94a in the thickness direction and a staircase portion 94b connecting the tip end of the lower portion 94a and the proximal end of the upper portion 94c. More specifically, the distance between the upper portion 94c and the engagement arms 93 in the thickness direction is larger than the distance between the lower portion 94a and the engagement arms 93 in the thickness direction. The lower portion 94a is provided with an engagement hole 94d to be engaged with the engagement protrusion 82 of the first case 8 when the second case 9 is coupled to the first case 8. The engagement hole 94d functions as an engagement hole for pressing. The engagement protrusion 82 may be formed on the pressing member 94 and the engagement hole 94d may be formed in the first case 8.

The first and second cases 8 and 9 are made of a resin and include electrodes 46, 47 and 48 formed by insert molding as shown in FIG. 8. The electrodes 46, 47 and 48 are arranged to be opposed to the external electrodes 36, 35 and 37 of the actuator body 3 contained in the case 4, respectively. More specifically, the electrode 46 is arranged on part of the inner surface of the first short side wall portion 43 of the first case 8 opposed to the external electrode 36 of the actuator body 3. The electrode 47 is arranged on part of the inner surface of the long side wall portion 45 of the first case 8 opposed to the external electrode 35 of the actuator body 3. The electrode 48 is arranged on part of the inner surface of the second short side wall portion 44 of the second case 9 opposed to the external electrode 37 of the actuator body 3. These electrodes 46, 47 and 48 are electrically connected to terminal electrodes 46a, 47a and 48a provided on the outer surface of the long side wall portion 45 of the first case 8, respectively. The electrode 48 and the terminal electrode 48a are configured so that the electrical conduction is established therebetween when the second case 9 is coupled to the first case 8. The first and second cases 8 and 9 including the electrodes 46, 47 and 48 and the terminal electrodes 46a, 47a and 48a may be provided by methods other than the insert molding, such as MID (Mold Interconnection Device), as will be appreciated. The configuration of the electrodes also may be different, as will be appreciated. The electrodes 46, 47 and 48 function as on-case electrodes and the terminal electrodes 46a, 47a and 48a function as power supply electrodes.

Figure 9:
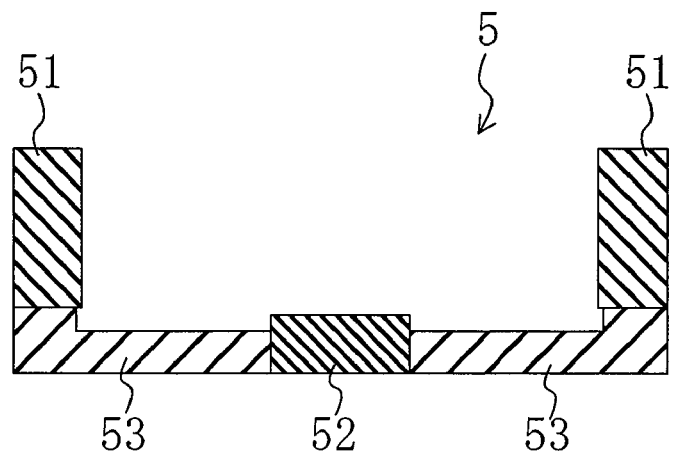
FIG. 9 is a front view of a support unit.

The support unit 5 includes two support rubbers 51 for elastically supporting the actuator body 3, a bias rubber 52 for biasing the actuator body 3 toward the stage 11 and connecting rubbers 53 for connecting the support rubbers 51 and the bias rubber 52. The support unit 5 is substantially U-shaped as shown in FIG. 9.

Each of the support rubbers 51 is made of conductive rubber prepared by mixing metallic particles to silicone rubber and is substantially in the form of a rectangular parallelepiped. The support rubbers 51 elastically support the actuator body 3 in the longitudinal direction (i.e., the longitudinal direction corresponds to the supporting direction). The support rubbers 51 function as support members.

Just like the support rubbers 51, the bias rubber 52 is also made of conductive rubber prepared by mixing metallic particles to silicone rubber and is substantially in the form of a rectangular parallelepiped. The bias rubber 52 is adapted to bias the actuator body 3 in the lateral direction (i.e., the lateral direction corresponds to the biasing direction). The bias rubber 52 functions as a bias member.

The support rubbers 51 and the bias rubber 52 preferably have a hardness of about 60 to 80.

The connecting rubbers 53 are not made of conductive rubber, but are made of insulating rubber. The connecting rubbers 53 connect the bias rubber 52 and one of the support rubbers 51 and connect the bias rubber 52 and the other support rubber 51 so as to provide an integral U-shaped support unit 5. In this state, the support rubbers 51 and the bias rubber 52 protrude further toward the inside of the U-shaped support unit 5 than the connecting rubbers 53. The connecting rubbers 53 are made of rubber which is less hard than the support rubbers 51 and the bias rubber 52.

In the support unit 5 thus configured, the distance between the support rubbers 51 is substantially the same as the length of the actuator body 3 in the longitudinal direction. With the support unit 5 fitted around the actuator body 3, the bias rubber 52 and the two support rubbers 51 are opposed to the external electrodes 35, 36 and 37 of the actuator body 3, respectively, so that the rubbers are in contact with or adjacent to the corresponding external electrodes. In this state, since the support rubbers 51 and the bias rubber 52 protrude further toward the actuator body 3 than the connecting rubbers 53, the connecting rubbers 53 do not come to contact with the actuator body 3.

The attitude holding rubber 6 is placed in the opening 83 formed in the case 4 and in contact with the principle surface of the actuator body 3 contained in the case 4. The attitude holding rubber 6 is pressed toward the actuator body 3 by the pressing member 94 of the second case 9 so that it elastically holds the attitude of the actuator body 3 in the thickness direction by the elasticity of the attitude holding rubber 6 and the elasticity of the pressing member 94. The attitude holding rubber 6 functions as an attitude holding member.

(Assembly of Ultrasonic Actuator)

Now, the assembly of the ultrasonic actuator 2 will be described.

Initially, the actuator body 3 and the support unit 5 are placed in the first case 8. Specifically, the support unit 5 is placed in the first case 8 so that one of the support rubbers 51 of the support unit 5 comes into contact with the electrode 46 in the first short side wall portion 43 of the first case 8, and the bias rubber 52 of the support unit 5 comes into contact with the electrode 47 in the long side wall portion 45 of the first case 8. The actuator body 3 is placed in the support unit 5 so that the external electrode 35 comes into contact with the bias rubber 52 of the support unit 5, the external electrode 36 comes into contact with or adjacent to one of the support rubbers 51 of the support unit 5, and the external electrode 37 comes into contact with or adjacent to the other support rubber 51 of the support unit 5. In this state, the other support rubber 51 of the support unit 5 partially or entirely protrudes outward from the open end of the first case 8, or the other end in the longitudinal direction.

As will be appreciated, the assembling order may be changed. The support unit 5 may be placed in the first case 8 and then the actuator body 3 may be placed in the support unit 5. Alternatively, the actuator body 3 combined with the support unit 5 may be placed in the first case 8.

Then, the attitude holding rubber 6 is placed in the opening 83 of the first case 8. The attitude holding rubber 6 is adhered to the principle surface of the actuator body 3. More specifically, the attitude holding rubber 6 protrudes outwardly in the thickness direction from the principal wall portion 41 of the first case 8. With the attitude holding rubber 6 placed in this position, the total dimension of the attitude holding rubber 6 and the first case 8 in the thickness direction is larger than the distance between the upper portion 94c of the pressing member 94 of the second case 9 and the engagement arms 93 in the thickness direction.

Figure 10:
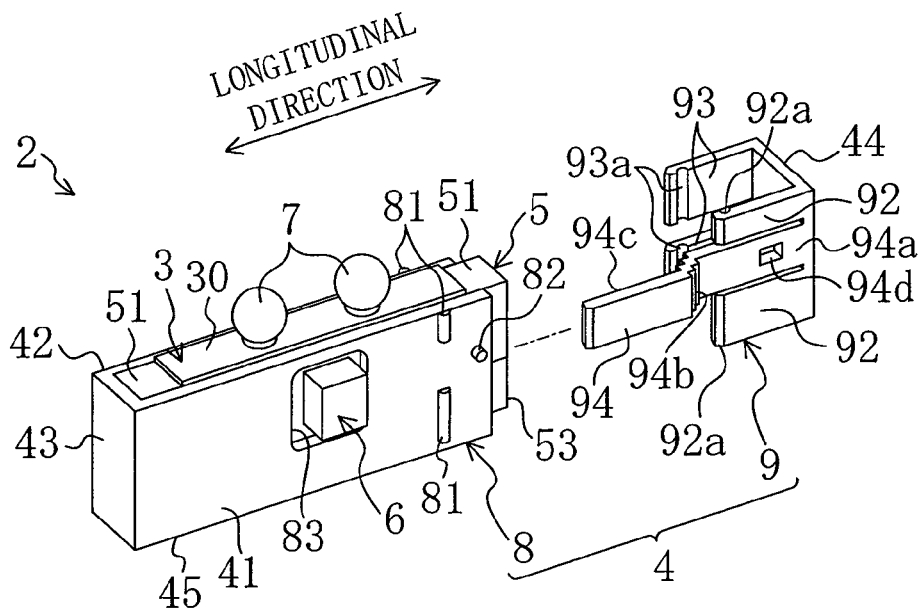
FIG. 10 is a perspective view illustrating the ultrasonic actuator in the course of the assembly with a second case not yet coupled to a first case.
Figure 11:
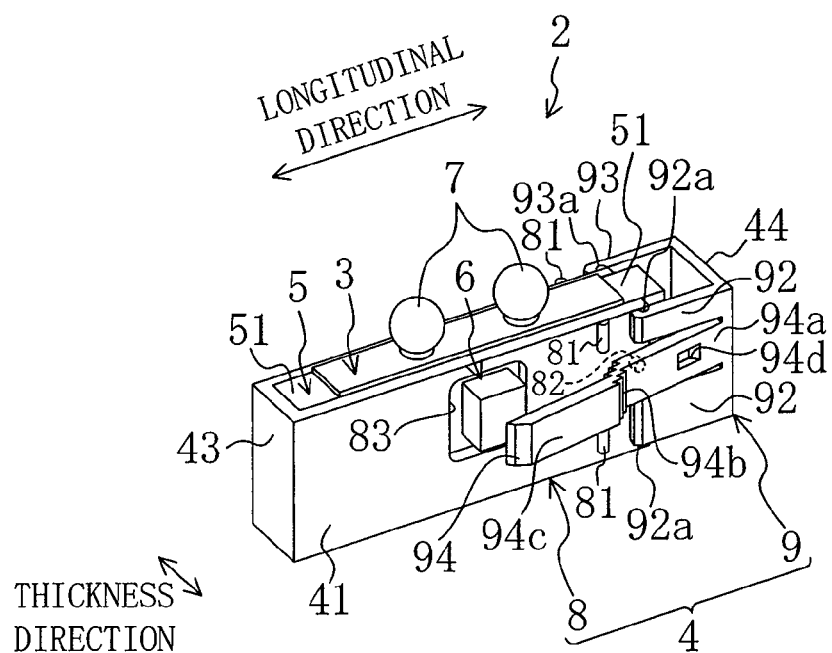
FIG. 11 is a perspective view illustrating the ultrasonic actuator in the course of the assembly with the second case being coupled to the first case.

Then, to the first case 8 in which the actuator body 3, the support unit 5 and the attitude holding rubber 6 have been placed (see FIG. 10), the second case 9 is coupled by sliding the second case 9 in the direction from the other end to the one end in the longitudinal direction. First, in the beginning of the coupling, the open end (the other end in the longitudinal direction) of the first case 8 is sandwiched between the engagement arms 92 and the pressing member 94, and the engagement arms 93 of the second case 9. As the second case 9 is slid on the first case 8 from the other end to the one end in the longitudinal direction, the tip end of the lower portion 94a of the pressing member 94 formed in the second case 9 comes into contact with the engagement protrusion 82 formed on the principal wall portion 41 of the first case 8. Then, as shown in FIG. 11, as the second case 9 is pushed further toward the one end in the longitudinal direction, the lower portion 94a moves up and stays on the engagement protrusion 82 (not shown in FIG. 11). As a result, the upper portion 94c of the pressing member 94 moves outwardly in the thickness direction to be spaced further away from the principal wall portion 41 of the first case 8. Since the upper portion 94c is spaced further away from the principal wall portion 41, the tip end of the upper portion 94c is prevented from hitting against the attitude holding rubber 6 even if the tip end comes to a position overlapping the attitude holding rubber 6 in the longitudinal direction. Therefore, the upper portion 94c, or the second case 9, is able to move further toward the one end in the longitudinal direction.

As the second case 9 is further pushed toward the one end in the longitudinal direction, the inner surface of the second short side wall portion 44 of the second case 9 comes into contact with the other support member 51 from the other end in the longitudinal direction.

As the second case 9 is further pushed toward the one end in the longitudinal direction, the support unit 5 is compressed in the longitudinal direction and the tip ends of the engagement arms 92 and 93 come into contact with the engagement bumps 81 of the first case 8, respectively. As the second case 9 is kept pushed toward the one end in the longitudinal direction, the engagement arms 92 and 93 of the second case 9 travel across the engagement bumps 81, and the engagement hooks 92a and 93a are engaged with the engagement bumps 81 as shown in FIG. 2. At that time, the engagement hooks 92a and 93a are engaged with the engagement bumps 81 on one hand, and the engagement protrusion 82 of the first case 8 is fitted in the engagement hole 94d formed in the lower portion 94a of the pressing member 94 on the other hand. As a result, the lower portion 94a no longer stays on the engagement protrusion 82 and the pressing member 94 kept spaced from the principal wall portion moves inwardly in the thickness direction, i.e., toward the first case 8. In this state, the upper portion 94c of the pressing member 94 overlaps the attitude holding rubber 6 in the longitudinal direction. Therefore, the upper portion 94c presses the attitude holding rubber 6 inwardly in the thickness direction, i.e., toward the actuator body 3, as it moves toward the first case 8. As a result, the attitude holding rubber 6 is compressed between the principle surface of the actuator body 3 facing the pressing member 94 and the upper portion 94c of the pressing member 94, thereby keeping pressing the actuator body 3 onto the principal wall portion 42 of the case 4.

In this manner, the second case 9 is coupled to the first case 8 to finish the assembly of the ultrasonic actuator 2.

In the ultrasonic actuator 2 thus assembled, as shown in FIGS. 2 and 8, the actuator body 3 is contained in the case 4 with the driver elements 7 protruding outward. The support unit 5 is placed between the actuator body 3 and the case 4. In this state, the support rubbers 51 are compressed as the second case 9 is coupled to the first case 8 so as to elastically support the actuator body 3 in the longitudinal direction with respect to the case 4. The short sides of the actuator body 3 with which the support rubbers 51 come into contact are antinodes of the longitudinal vibration, i.e., non-node parts. Since the support rubbers 51 are elastic bodies, they do not hinder the longitudinal vibration of the actuator body 3.

The connecting rubbers 53 are less hard than the bias rubber 52. Therefore, the connecting rubbers 53 are compressed to a further extent than the bias rubber 52. The bias rubber 52 is hardly deformed in the lateral direction. Before setting the ultrasonic actuator 2 to the stage 11, the bias rubber 52 does not bias the actuator body 3 in the lateral direction. However, the bias rubber 52 may be configured to bias the actuator body 3 in the lateral direction before the setting. That is, the bias rubber 52 may be placed in the case 4 in the compressed state. After the second case 9 is coupled to the first case 8, the connecting rubbers 53 do not protrude further toward the actuator body 3 than the support rubbers 51 and the bias rubber 52. That is, the connecting rubbers 53 are not in contact with the actuator body 3 so as not to hinder the contact of the support rubbers 51 and the bias rubber 52 with the actuator body 3 and not to hinder the vibration of the actuator body 3. However, the connecting rubbers 53 may be in contact with the actuator body 3 as long as they do not hinder the contact of the support rubbers 51 and the bias rubber 52 with the actuator body 3 and the vibration of the actuator body 3.

Between the actuator body 3 and the case 4, one of the support rubbers 51 is placed between the external electrode 36 of the actuator body 3 and the electrode 46 of the case 4 to bring them into electrical conduction. The other support rubber 51 is placed between the external electrode 37 of the actuator body 3 and the electrode 48 of the case 4 to bring them into electrical conduction. The bias rubber 52 is placed between the external electrode 35 of the actuator body 3 and the electrode 47 of the case 4 to bring them into electrical conduction.

The ultrasonic actuator 2 thus assembled is set to the stage 11 so that the longitudinal direction is parallel to the lengthwise direction of the rails 12, and the driver elements 7 come into contact with one of the side end faces of the stage 11 parallel to the rails 12. More specifically, the case 4 is fixed to the base with the driver elements 7 pressed onto the stage 11 so that the bias rubber 52 is compressed. That is, when the ultrasonic actuator 2 is set to the stage 11, the actuator body 3 is biased by the bias rubber 52 in the direction along which the ultrasonic actuator 2 comes into contact with the stage 11, i.e., the normal direction of the long side surface of the actuator body 3 on which the driver elements 7 are provided (the long side surface of the piezoelectric element 30). The normal direction is identical to the lateral direction. Signal wires from the control unit (not shown) are electrically connected to the terminal electrodes 46a, 47a and 48a of the case 4 through connecting pins.

In the ultrasonic actuator 2, the terminal electrode 47a is connected to electrical ground by the signal wire. AC voltages having phases shifted from each other by 90° (or −90°) are applied to the terminal electrodes 46*a* and 48*a* by the signal wire. Accordingly, as described above, the actuator body 3 vibrates as shown in FIGS. 7A to 7D and the driver elements 7 make a substantially elliptical motion on a plane parallel to the principle surface of the actuator body 3 to output a driving force. In this state, since the case 4 is fixed to the base and the driver elements 7 are in contact with the side end face of the stage 11, the driving force generated by the driver elements 7 is transmitted to the stage 11, thereby driving the stage 11 to move along the rails 12. Further, since the driver elements 7 are biased toward the stage 11 by the bias rubber 52, friction between the driver elements 7 and the side end face of the stage 11 is increased. Therefore, the driving force of the driver elements 7 is transmitted to the stage 11 with efficiency. Further, since the support rubbers 51 supporting the actuator body 3 vibrating as shown in FIGS. 7A to 7D in the case 4 are elastic bodies, the vibration of the actuator body 3 is not hindered even if the support rubbers 51 support the actuator body 3 at the non-node parts of the longitudinal vibration of the actuator body 3. Therefore, the actuator body 3 is well supported with respect to the case 4.

According to Embodiment 1, the case 4 containing the actuator body 3 and the support unit 5 is separable into the first case 8 and the second case 9. The actuator body 3 and the support unit 5 are placed in the first case 8 in advance, and then the second case 9 is coupled to the first case 8 by sliding the second case 9 in the supporting direction along which the actuator body 3 is elastically supported (the direction along which elastic force is applied). At the same time, the support rubbers 51 of the support unit 5 are compressed. Thus, the ease of assembly of the ultrasonic actuator 2 is improved and the positions of the support rubbers 51 are determined with improved precision.

More specifically, the support rubbers 51 are placed between the first case 8 and the actuator body 3 before coupling the second case 9 to the first case 8, i.e., when external force is hardly exerted on the support rubbers 51. Therefore, the support rubbers 51 are easily placed. After that, the second case 9 is coupled to the first case 8 in which the support rubbers 51 have been placed, and therefore, the support rubbers 51 are compressed to elastically support the actuator body 3. Thus, it is no longer necessary to insert the support rubbers in the compressed state in the gaps between the actuator body 3 and the case 4, and the ease of assembly of the ultrasonic actuator 2 can be improved.

In the course of the placement of the support rubbers 51 at the desired positions before coupling the second case 9 to the first case 8 where the external force is hardly exerted on the support rubbers 51, and in the course of the coupling of the second case 9 to the first case 8, the support rubbers 51 receive only a force in the compressing direction. That is, they do not receive any force in such a direction that may change their positions. Therefore, the positions of the support rubbers 51 are almost determined when the support unit 5 and the actuator body 3 are placed in the first case 8 in advance. This makes it possible to determine the positions of the support rubbers 51 with precision. As a result, the support rubbers 51 are placed with precision at the desired positions with respect to the actuator body 3. Accordingly, the resonance frequency of the actuator body 3 (more specifically, the resonance frequency of the piezoelectric element 30) is controlled to a desired value and the actuator body 3 generates a desired vibration. At the same time, the support rubbers 51 are placed between the actuator body 3 and the case 4 with precision so that one of them comes into contact with the external electrode 36 and the electrode 46 and the other comes into contact with the external electrodes 37 and the electrode 48. This makes it possible to establish electrical conduction between the external electrodes 36 and 37 of the actuator body 3 and the electrodes 46 and 48 of the case 4 with reliability.

Since the support rubbers 51 are connected by the connecting rubbers 53 to become the integral support unit 5, the parts count is reduced and the workability during the assembly is improved.

The bias rubber 52 for biasing the actuator body 3 toward the stage 11 is also integrated with the support rubbers 51 by the connecting rubbers 53. Therefore, the parts count is further reduced and the workability during the assembly is further improved.

Since the support rubbers 51 and the bias rubber 52 are integrated into the single support unit 5, the positional relationship among the rubbers is determined in advance. Therefore, the positions of the support rubbers 51 and the bias rubber 52 with respect to the actuator body 3 and the case 4 are determined only by placing the support unit 5 in the first case 8. That is, as long as the actuator body 3 and the support unit 5 are assembled to the first case 8, the support rubbers 51 and the bias rubber 52 are automatically positioned to come into contact with the external electrodes 36, 37 and 35 of the actuator body 3 and the electrodes 46, 48 and 47 of the case 4, respectively.

The support rubbers 51 and the bias rubber 52 may be integrated by connecting them with a flexible board as described later. However, according to the structure of Embodiment 1, the support rubbers 51, the bias rubber 52 and the connecting rubbers 53 are easily molded integrally because they are all made of rubber. As the flexible board is not necessary, the structure of the support unit 5 is simplified. Further, since the rubber is stiffer than the flexible board in general, the positional relationship among the rubbers is maintained with more reliability.

The connecting rubbers 53 are made of rubber which is less hard than the support rubbers 51 and the bias rubber 52. Therefore, the connecting rubbers 53 do not have any adverse effect on the supporting force and the biasing force applied to the actuator body 3. Further, with the actuator body 3 placed in the case 4, the actuator body 3 is in contact with the support rubbers 51 and the bias rubber 52, but not in contact with the connecting rubbers 53. Therefore, the vibration of the actuator body 3 is not hindered by the connecting rubbers 53. As long as the connecting rubbers 53 are less hard than the support rubbers 51 and the bias rubber 52, the connecting rubbers 53 are less likely to hinder the vibration of the actuator body 3 even if the connecting rubbers 53 are in contact with the actuator body 3.

The terminal electrodes 46*a*, 48*a* and 47*a* are provided on the outer surface of the case 4 and the electrodes 46, 48 and 47 electrically connected to the terminal electrodes 46*a*, 48*a* and 47*a* are provided on the inner surface of the case 4. The actuator body 30 is provided with the external electrodes 36, 37 and 35 electrically connected to the first power supply electrode layer 32, the second power supply electrode layer 33 and the common electrode layers 34. Further, the support rubbers 51 and the bias rubber 52 made of conductive rubber are placed between the external electrodes 36, 37 and 35 of the actuator body 3 and the electrodes 46, 48 and 47 of the case 4, respectively. Accordingly, there is no need to directly connect power supply wires to the piezoelectric element 30 by soldering. When the wires are connected to the surface of the piezoelectric element 30 by soldering, stress is concentrated on the soldered parts of the piezoelectric element 30 upon vibration of the piezoelectric element 30 and the piezoelectric element 30 may possibly be broken. However, according to the structure of Embodiment 1, there is no need to solder the wires and the break of the piezoelectric element is prevented. Further, the step of connecting the wires by soldering is omitted. This makes it possible to reduce the number of steps of assembling the ultrasonic actuator 2 and improve the ease of assembly.

As described above, the resonance frequency of the piezoelectric element 30 is influenced by the force supporting the actuator body 3, i.e., the elastic force of the compressed support rubbers 51. According to Embodiment 1, the second case 9 is coupled to the first case 8 with the engagement hooks 92a and 93a being engaged with the engagement bumps 81. Therefore, the distance between the first short side wall portion 43 of the first case 8 and the second short side wall portion 44 of the second case 9 is kept constant. Thus, the pressure applied by the support rubbers 51 to the piezoelectric element 30 is stabilized.

For easy placement of the actuator body 3 in the first case 8, a small gap is left between the first case 8 or the case 4 and the actuator body 3 in the thickness direction. According to Embodiment 1, the attitude of the actuator body 3 placed in the case 4 is held by pressure applied by the attitude holding rubber 6 and the pressing member 94 of the second case 9 toward the case 4 in the thickness direction. Therefore, even when the actuator body 3 vibrates, the attitude of the actuator body 3 in the thickness direction is maintained and the contact between the driver elements 7 and the stage 11 is stabilized. As a result, the driving force is transmitted from the ultrasonic actuator 2 to the stage 11 with stability.

According to Embodiment 1, a means of pressing the attitude holding rubber 6, i.e., the pressing member 94, is integrated with the second case 9. The pressing member 94 presses the attitude holding rubber 6 when the second case 9 is coupled to the first case 8. Therefore, the parts count is reduced and the ease of assembly is improved.

The pressing member 94 is not in contact with the attitude holding rubber 6 until the coupling of the second case 9 to the first case 8 is finished. The pressing member 94 applies pressure to the attitude holding rubber 6 simultaneously when the coupling of the second case 9 to the first case 8 is finished. Accordingly, there is no need to couple the second case 9 to the first case 8 by sliding the pressing member 94 on the surface of the attitude holding rubber 6. The second case 9 is coupled to the first case 8 by only a small force. Thus, the ease of assembly is further improved.

According to Embodiment 1, the support rubbers 51 and the bias rubber 52 are made of conductive rubber so that they establish electrical conduction between the electrodes of the actuator body 3 and the electrodes of the case 4. However, the present invention is not limited thereto. For example, as described above, power supply wires may be connected to the electrodes formed on the surface of the piezoelectric element 30 by soldering to feed the actuator body 3. In this case, the support rubbers 51 and the bias rubber 52 may be made of rubber other than the conductive rubber. Alternatively, the support rubbers 51, the bias rubber 52 and the connecting rubbers 53 may be made of the same rubber. In this way, the support unit 5 is easily molded. Also in this case, it is preferable that support rubbers 51 and the bias rubber 52 protrude further toward the actuator body 3 than the connecting rubbers 53 as described above. That is, with the actuator body 3 placed in the case 4, the connecting rubbers 53 are not in contact with the actuator body 3. With this configuration, the support unit 5 is prevented from hindering the vibration of the actuator body 3.

According to Embodiment 1, the ultrasonic actuator 2 includes the bias rubber 52. However, the bias rubber 52 may be omitted. More specifically, the ultrasonic actuator 2 may include, instead of the bias rubber, a biasing member for biasing the actuator body 3 toward a drive target, such as the stage 11, when the ultrasonic actuator 2 is set to the stage 11 or other drive target. In this case, the case 4 is preferably provided with an opening so that the biasing member is brought into contact with the side surface of the actuator body 3 to which the driver elements 7 are not attached.

According to Embodiment 1, the support rubbers 51 are integrated into the support unit 5. However, the support rubbers 51 may not necessarily be integrated. For example, when the ultrasonic actuator 2 is oriented so that the one end in the longitudinal direction comes to the bottom and the other end in the longitudinal direction comes to the top, the ultrasonic actuator 2 is easily assembled and the positions of the support rubbers 51 are determined with precision. More specifically, the support rubber 51 at the one end in the longitudinal direction is placed in the first case 8, and then the actuator body 3 is placed thereon. Further, the support rubber 51 at the other end in the longitudinal direction is placed on the actuator body 3. In this state, the second case 9 is slid onto the first case 8 in the direction from the other end to the one end in the longitudinal direction, i.e., from the top to the bottom. Thus, the ultrasonic actuator 2 is assembled with the positions of the support rubbers 51 unchanged before and after the coupling of the second case 9, i.e., without moving the support rubbers 51 in the short side and thickness directions.

In this case, the bias rubber 52 is preferably configured so that its position in the longitudinal direction is maintained. For example, the position of the bias rubber 52 in the longitudinal direction may be maintained by the connecting rubber 53 between the bias rubber 52 and the support rubber 51 at the one end in the longitudinal direction (bottom end). In this case, the connecting rubber 53 may be or may not be integrated with the bias rubber 52 and the support rubbers 51. However, it is preferable that the support rubbers 51, the bias rubber 52 and the connecting rubber 53 are integrated because the parts count is reduced and the workability is improved.

Embodiment 2

Embodiment 2 of the present invention will now be described. In an ultrasonic actuator 202 of Embodiment 2, a case 204 and a support unit 205 are different from those of Embodiment 1. The same components as those of Embodiment 1 are indicated by the same reference numerals to omit the explanation.

Figure 12:
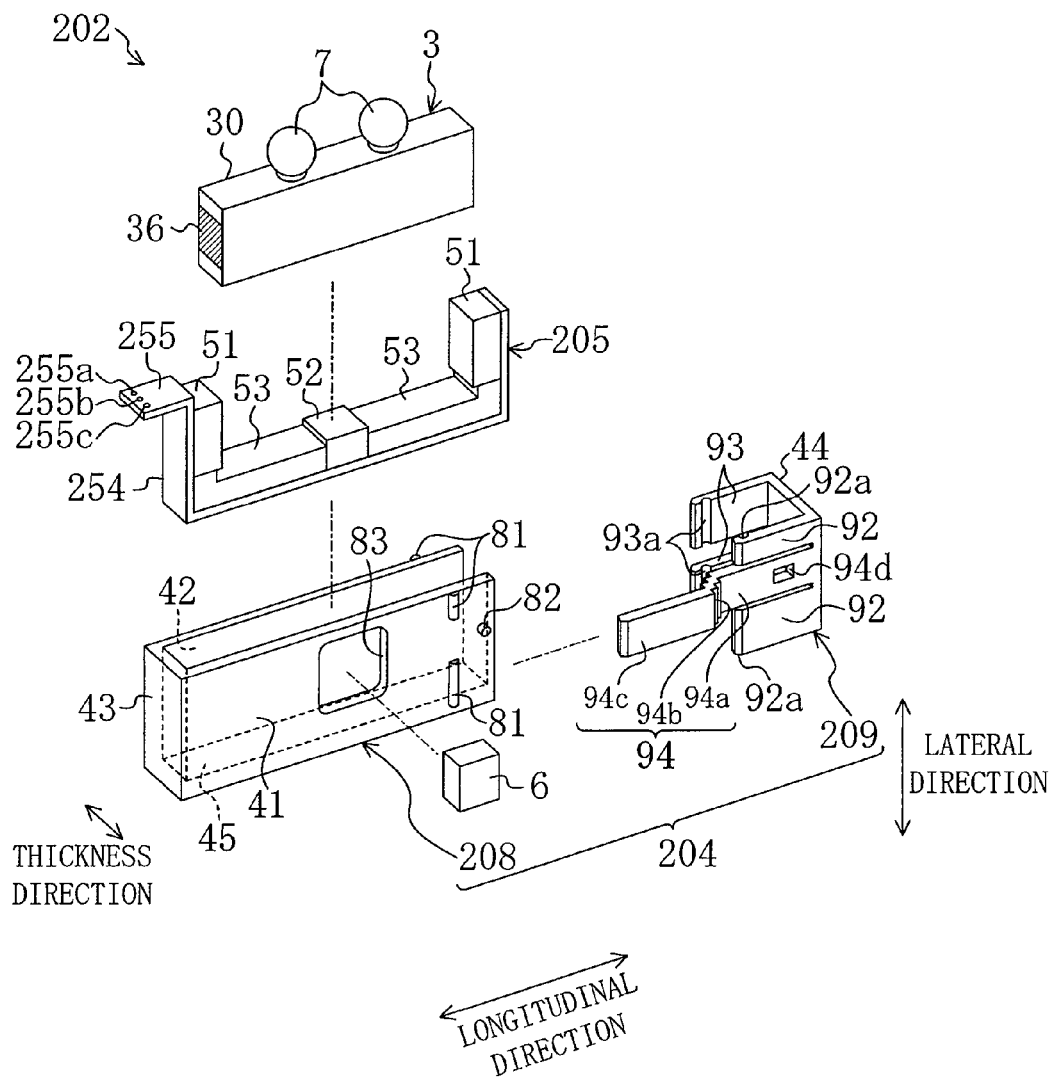
FIG. 12 is an exploded perspective view of an ultrasonic actuator according to Embodiment 2.

Specifically, the support unit 205 of the ultrasonic actuator 202 according to Embodiment 2 includes, as shown in FIG. 12, two support rubbers 51 for elastically supporting the actuator body 3, a bias rubber 52 for biasing the actuator body 3 toward the stage 11 (see FIG. 3), connecting rubbers 53 for connecting the support rubbers 51 and the bias rubber 52, and a flexible board 254. The support unit 205 is substantially U-shaped.

The support rubbers 51, the bias rubber 52 and the connecting rubbers 53 are configured in the same manner as those of Embodiment 1. That is, the support rubbers 51 and the bias rubber 52 are integrated with each other by the connecting rubbers 53.

The substantially U-shaped unit formed of the support rubbers 51, the bias rubber 52 and the connecting rubbers 53 is combined with a flexible board 254 provided along the outer periphery of the U-shaped unit, i.e., the outer periphery facing the case 204. In parts of the flexible board 254 corresponding to the support rubbers 51 and the bias rubber 52, electrodes (not shown) to be connected with the support rubbers 51 and the bias rubber 52 are formed, respectively. The support rubbers 51 and the bias rubber 52 are soldered to the electrodes of the flexible board 254 by reflowing. The flexible board 254 and the connecting rubbers 53 function as a connecting member.

Figure 13:
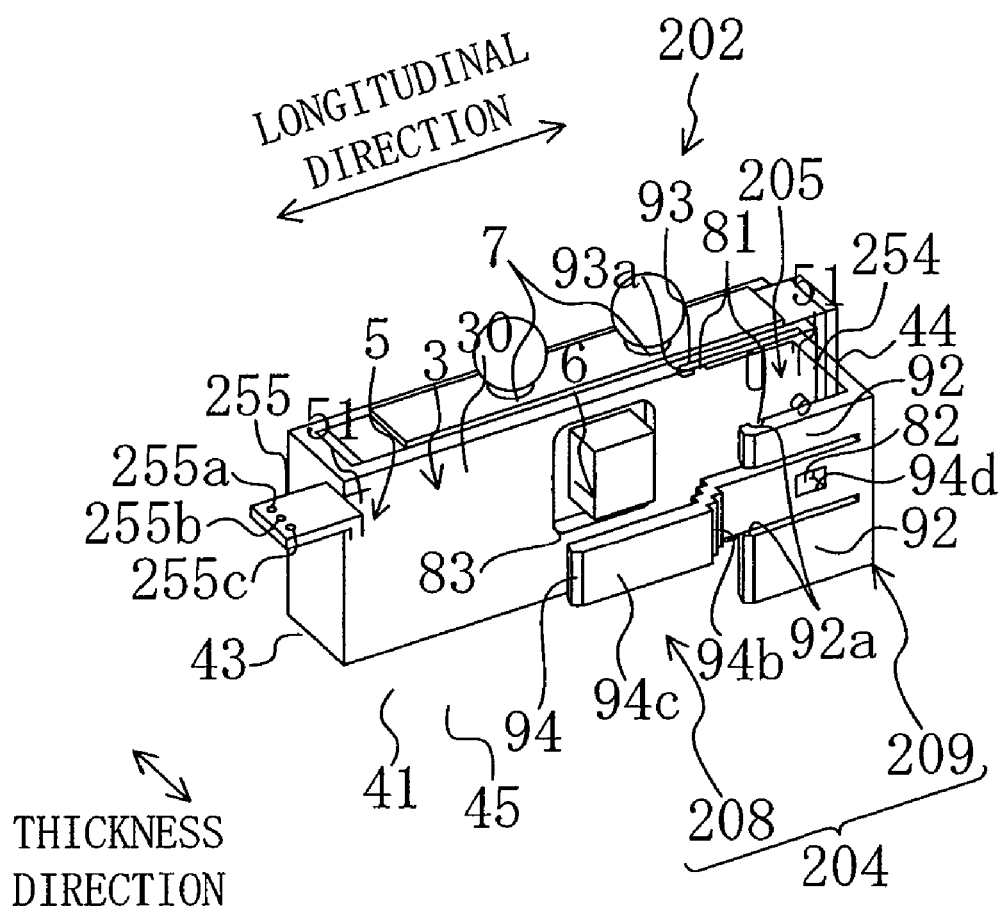
FIG. 13 is a perspective view of the ultrasonic actuator.

At one end of the flexible board 254 (one end corresponding to the support rubber 51 at the one end in the longitudinal direction), an extension 255 protruding from the case 204 in the state where the support unit 205 is placed in the case 204 is provided as shown in FIG. 13. The extension 255 includes three terminal electrodes 255a, 255b and 255c electrically connected to the electrodes to which the support rubbers 51 and the bias rubber 52 have been connected.

The case 204 does not have the electrodes 46, 47 and 48 and the terminal electrodes 46a, 47a and 48a mentioned in Embodiment 1.

More specifically, in the ultrasonic actuator 202, signal wires from the control unit are connected to the terminal electrodes 255a, 255b and 255c of the flexible board 254 and the piezoelectric element 30 is fed through the terminal electrodes 255a, 255b and 255c.

According to Embodiment 2, similarly to Embodiment 1, the positions of the support rubbers 51 are roughly determined before the second case 209 is coupled to the first case 208. Therefore, the positions of the support rubbers 51 are determined with improved precision. In addition, the support rubbers 51 in the compressed state are placed between the actuator body 3 and the case 204 by coupling the second case 209 to the first case 208. Therefore, the ease of assembly of the ultrasonic actuator 202 is improved.

Different from Embodiment 1, there is no need to form the electrodes on the case 204. Therefore, the structure of the case 204 is simplified and the manufacturing cost of the case 204 is reduced.

In the support unit 205, not only the flexible board 254 but also the connecting rubbers 53 connect the support rubbers 51 and the bias rubber 52. Therefore, the support unit 205 becomes stiffer than a support unit described later in which the support rubbers 51 and the bias rubber 52 are connected only by the flexible board 354. Therefore, the positional relationship among the rubbers is maintained with more reliability and the support rubbers 51 and the bias rubber 52 are placed at desired positions with ease.

Other than the above-described features, Embodiment 2 provides features similar to those of Embodiment 1.

Embodiment 3

Embodiment 3 of the present invention will now be described. In an ultrasonic actuator 302 of Embodiment 3, a case 304 and a support unit 305 are different from those of Embodiment 1. The same components as those of Embodiment 1 are indicated by the same reference numerals to omit the explanation.

Figure 14:
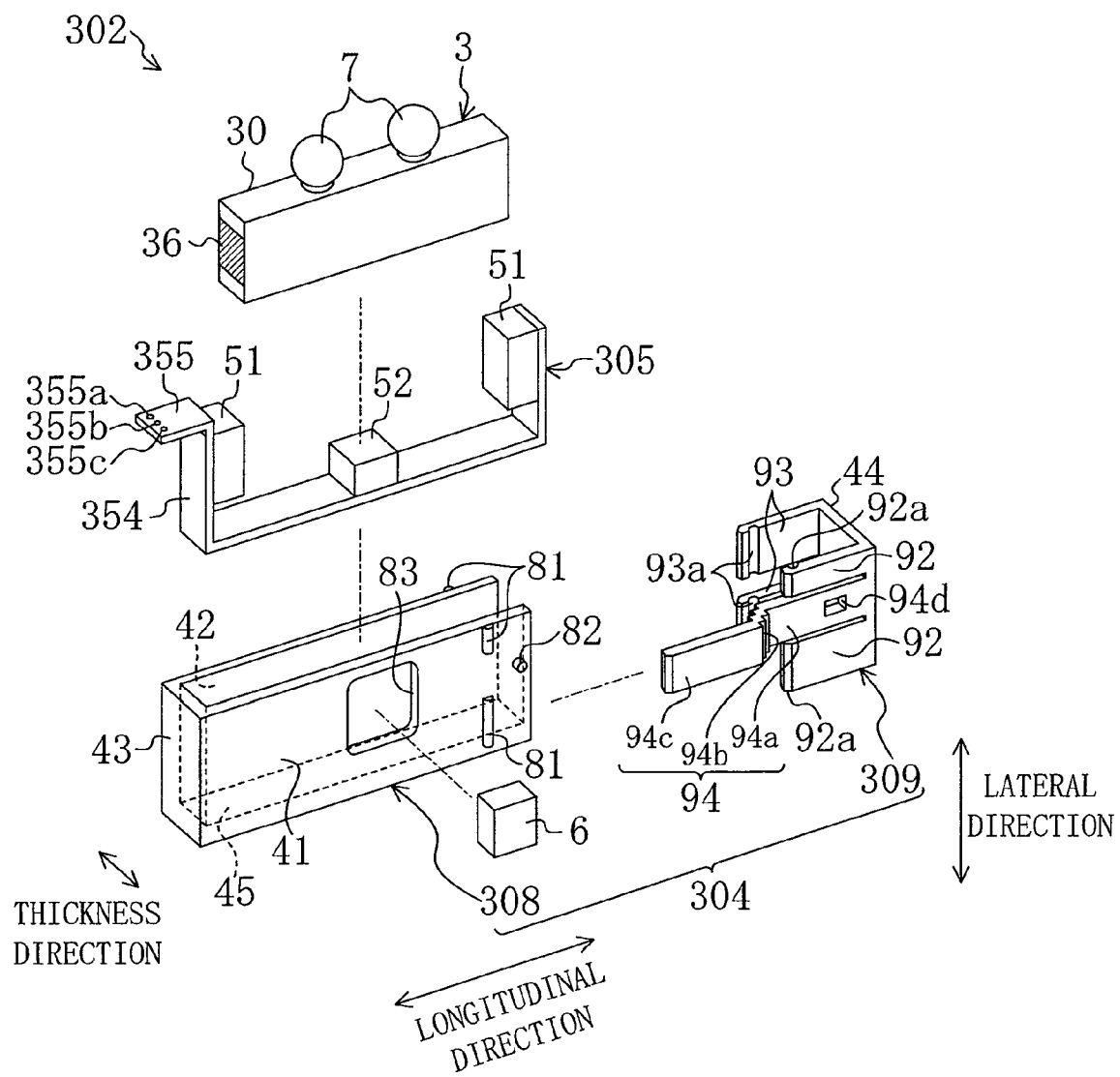
FIG. 14 is an exploded perspective view of an ultrasonic actuator according to Embodiment 3.

Specifically, the support unit 305 of the ultrasonic actuator 302 according to Embodiment 3 includes, as shown in FIG. 14, two support rubbers 51 for elastically supporting the actuator body 3, a bias rubber 52 for biasing the actuator body 3 toward the stage 11 (see FIG. 3) and a flexible board 354 for connecting the support rubbers 51 and the bias rubber 52. The support unit 305 is substantially U-shaped.

The flexible board 354 is substantially U-shaped. The support rubbers 51 and the bias rubber 52 are placed on the inner surface of the substantially U-shaped flexible board 354. In parts of the flexible board 354 corresponding to the support rubbers 51 and the bias rubber 52, electrodes (not shown) to be connected with the support rubbers 51 and the bias rubber 52 are formed, respectively. The support rubbers 51 and the bias rubber 52 are soldered to the electrodes of the flexible board 354 by reflowing. The flexible board 354 functions as a connecting member.

In the support unit 305 thus integrated, when the actuator body 3 is placed in such a manner that the external electrode 35 formed in the long side surface of the actuator body 3 is in contact with the bias rubber 52, the two support rubbers 51 are opposed to the external electrodes 36 and 37 of the actuator body 3, respectively, so that the support rubbers 51 are in contact with or adjacent to the corresponding external electrodes 36 and 37.

Similarly to Embodiment 2, an extension 355 protruding from the case 304 in the state where the support unit 305 is placed in the case 304 is provided at one end of the flexible board 354 (one end corresponding to the one end of the support rubber 51 in the longitudinal direction). The extension 355 includes three terminal electrodes 355a, 355b and 355c electrically connected to the electrodes to which the support rubbers 51 and the bias rubber 52 have been connected.

The case 304 does not have the electrodes 46, 47 and 48 and the terminal electrodes 46a, 47a and 48a mentioned in Embodiment 1.

More specifically, in the ultrasonic actuator 302, signal wires from the control unit are connected to the terminal electrodes 355a, 355b and 355c of the flexible board 354 and the piezoelectric element 30 is fed through the terminal electrodes 355a, 355b and 355c.

According to Embodiment 3, similarly to Embodiment 1, the positions of the support rubbers 51 are roughly determined before the second case 309 is coupled to the first case 308. Therefore, the positions of the support rubbers 51 are determined with improved precision. In addition, the support rubbers 51 in the compressed state are placed between the actuator body 3 and the case 304 by coupling the second case 309 to the first case 308. Therefore, the ease of assembly of the ultrasonic actuator 302 is improved.

Different from in Embodiment 1, there is no need to form the electrodes on the case 304. Therefore, the structure of the case 304 is simplified and the manufacturing cost of the case 304 is reduced.

Other than the above-described features, Embodiment 3 provides features similar to those of Embodiment 1.

Other Embodiments

The above-described embodiments of the present invention may be modified as follows.

Figure 15:
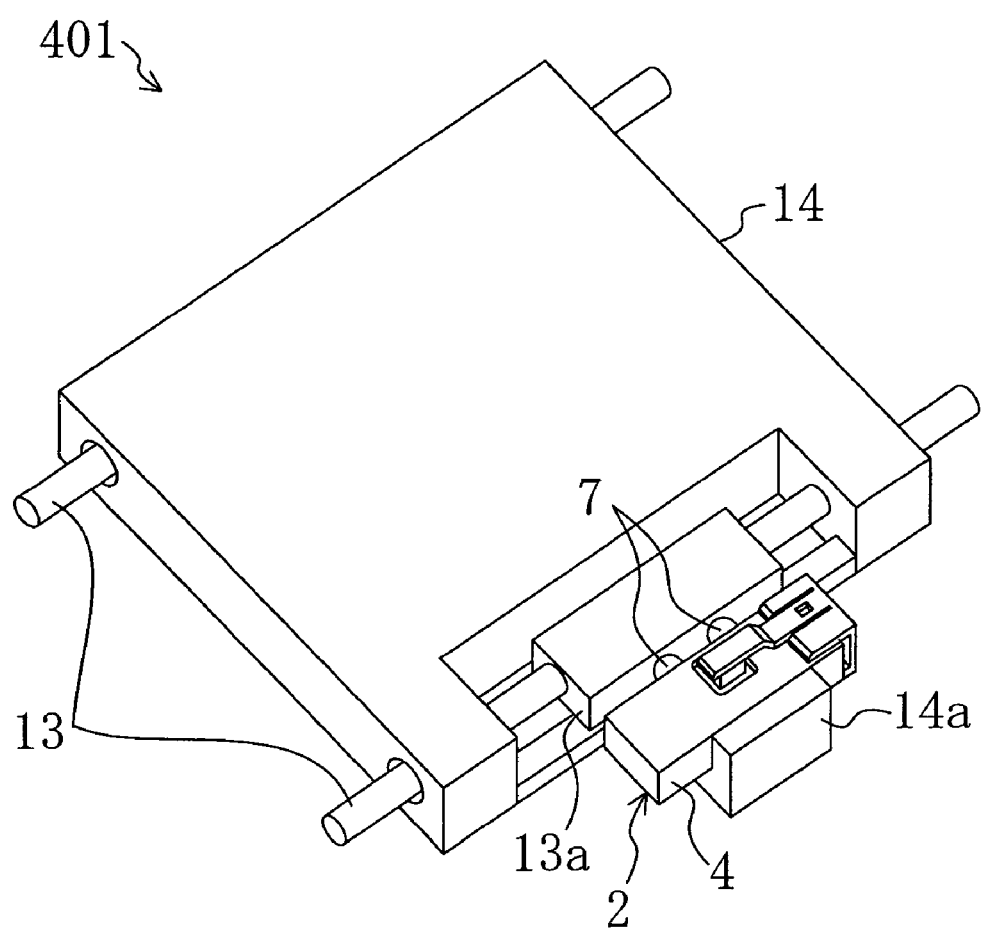
FIG. 15 is a perspective view of a drive unit according to other embodiment.

According to the above-described embodiments, the case 4 of the ultrasonic actuator 2 is fixed to the base and the driver elements 7 are brought into contact with the movable stage 11. Then, the ultrasonic actuator 2 is operated to drive the stage 11. Alternative to this, the structure shown in FIG. 15 may be employed. Specifically, a drive unit 401 includes rails 13 fixed to the base to be parallel with each other, a stage 14 slidably attached to the rails 13 and an ultrasonic actuator 2. One of the rails 13 is provided with an abutment 13a fixed to the rail 13. The stage 14 is provided with an actuator mount 14a. A case 4 is mounted on the actuator mount 14a of the stage 14 such that driver elements 7 of the ultrasonic actuator 2 are in contact with the abutment 13a of the rail 13. When the ultrasonic actuator 2 is operated in this state, the driver elements 7 deliver the driving force to the abutment 13a. Then, the ultrasonic actuator 2 vibrates relatively to the abutment 13a along the length of the rails 13 because the abutment 13a is fixed. As a result, the stage 14 joined with the case 4 via the actuator mount 14a is driven along the length of the rails 13.

According to the embodiments described above, the driver elements 7 are provided on the long side surface of the piezoelectric element 30. However, the present invention is not limited thereto. For example, the driver elements 7 may be provided on the short side surface of the piezoelectric element 30. In this case, the actuator body 3 is elastically supported in the lateral direction and biased such that the driver elements 7 are in contact with the stage 11 positioned adjacent to them in the longitudinal direction. The ultrasonic actuator 2 drives the stage 11 to move in the lateral direction of the piezoelectric element 30.

According to the above-described embodiments, two driver elements 7 are provided. However, the present invention is not limited thereto. The number of the driver elements may be reduced to 1, or increased to 3 or more.

According to the above-described embodiments, two support rubbers 51 supporting the actuator body 3 are placed on the side surfaces of the actuator body 3 opposing to each other, respectively. However, two or more support rubbers 51 may be placed on each of the side surfaces.

The actuator body 3 is supported by the support rubbers 51. However, the actuator body 3 may be supported by elastic members, e.g., resin or metal springs.

According to the above-described embodiments, the pressing member 94 for pressing the attitude holding rubber 6 is integrated with the second case 9. However, the pressing member 94 may be separated from the second case 9.

According to the above-described embodiments, the actuator body 3 includes the piezoelectric element 30 and the driver elements 7. However, the actuator body 3 may include a resonator including the piezoelectric element 30 and driver elements 7 provided on the resonator. More specifically, the present invention is effective for a structure prepared by adhering a piezoelectric element on a substrate of metal or other material, and a structure prepared by embedding a piezoelectric element in a resonator made of metal or other material. In this case, the resonator including the piezoelectric element functions as the actuator body and the resonator is elastically supported in the case.

The above embodiments are merely preferred embodiments in nature and are not intended to limit the scope, applications and use of the invention.

As described above, the present invention is useful for an ultrasonic actuator in which a vibrating actuator body is elastically supported in a case.

What is claimed is:

1. An ultrasonic actuator which generates a driving force comprising:
   an actuator body having a piezoelectric element and generating a driving force by vibration;
   a case containing the actuator body; and
   at least two support members placed between the actuator body and the case to elastically support the actuator body at both sides of the actuator body in a supporting direction, wherein
   the case includes a first case provided with an opening at a position where one of the support members is placed and a second case coupled to the first case to cover the opening in the first case, and
   the support members are compressed when the second case is coupled to the first case and elastically support the actuator body in the compressed state.

2. The ultrasonic actuator of claim 1, further comprising:
   a bias member placed between the actuator body and the case to bias the actuator body toward a drive target to which the driving force is applied.

3. The ultrasonic actuator of claim 1, wherein
the two support members are integrated with each other by a connecting member.

4. The ultrasonic actuator of claim 3, wherein
the support members are made of rubber and
the connecting member is made of rubber which is less hard than the support members.

5. The ultrasonic actuator of claim 4, wherein
the support members protrude further toward the actuator body than the connecting member and
the connecting member is not in contact with the actuator body.

6. The ultrasonic actuator of claim 4, wherein
on-element electrodes for feeding the piezoelectric element are formed in side surfaces of the actuator body in contact with the support members,
the case has a power supply electrode for receiving externally applied power and on-case electrodes electrically connected to the power supply electrode to feed the actuator body,
the support members are made of conductive rubber and are in contact with the on-element electrodes of the actuator body and the on-case electrodes of the case, and
the connecting member is made of insulating rubber.

7. The ultrasonic actuator of claim 3, wherein
on-element electrodes for feeding the piezoelectric element are formed in side surfaces of the actuator body in contact with the support members,
the connecting member is made of a flexible printed board having a power supply electrode for receiving externally applied power,
the support members are made of conductive rubber and are fixed to the flexible printed board so that the support members are electrically connected to the power supply electrode and are in contact with the on-element electrodes of the actuator body.

8. The ultrasonic actuator of claim 2, wherein
at least one of the two support members placed between the first case and the actuator body is integrated with the bias member by the connecting member.

9. The ultrasonic actuator of claim 2, wherein
the two supporting members are integrated with the bias member by the connecting member.

10. The ultrasonic actuator of claim 8, wherein
the support members and the bias member are made of rubber and
the connecting member is made of rubber which is less hard than the support members and the bias member.

11. The ultrasonic actuator of claim 10, wherein
the support members and the bias member protrude further toward the actuator body than the connecting member and
the connecting member is not in contact with the actuator body.

12. The ultrasonic actuator of claim 10, wherein
on-element electrodes for feeding the piezoelectric element are formed in side surfaces of the actuator body in contact with the support members and the bias member,
the case has a power supply electrode for receiving externally applied power and on-case electrodes electrically connected to the power supply electrode to feed the actuator body,
the support members and the bias member are made of conductive rubber and are in contact with the on-element electrodes of the actuator body and the on-case electrodes of the case, and
the connecting member is made of insulating rubber.

13. The ultrasonic actuator of claim 8, wherein
on-element electrodes for feeding the piezoelectric element are formed in side surfaces of the actuator body in contact with the support members and the bias member,
the connecting member is made of a flexible printed board having a power supply electrode for receiving externally applied power, and
the support members and the bias member are made of conductive rubber and are fixed to the flexible printed board so that the support members and the bias member are electrically connected to the power supply electrode and are in contact with the on-element electrodes of the actuator body.

14. The ultrasonic actuator of claim 2, wherein
the supporting direction and a biasing direction of the bias member are orthogonal to each other.

15. The ultrasonic actuator of claim 2, wherein
the actuator body generates a plurality of vibrations different in vibrating directions,
the supporting direction corresponds to one of the vibrating directions of the actuator body, and
the biasing direction of the bias member corresponds to another one of the vibrating directions of the actuator body.

16. The ultrasonic actuator of claim 1, wherein
the second case is provided with an engagement part to be engaged with the first case,
the first case is provided with an counter engagement part to be engaged with the engagement part of the second case,
the second case is coupled to the first case as the engagement part is engaged with the counter engagement part.

17. The ultrasonic actuator of claim 1, further comprising:
an attitude holding member which is in contact with the actuator body to elastically hold the attitude of the actuator body, wherein
an opening is formed in part of the first case corresponding to the attitude holding member so that the attitude holding member is exposed outside the first case, and
the second case is provided with a pressing part for pressing the attitude holding member toward the actuator body through the opening formed in the first case.

18. The ultrasonic actuator of claim 17, wherein
the first case is provided with one of an engagement protrusion for pressing and an engagement hole for pressing which are engaged with each other when the second case is coupled to the first case,
the pressing part of the second case is provided with the other one of the engagement protrusion and the engagement hole,
the engagement protrusion raises the pressing part away from the first case so that the pressing part does not press the attitude holding member until the coupling of the second case to the first case is finished, and
the engagement protrusion is engaged with the engagement hole and presses the attitude holding member after the coupling of the second case to the first case is finished.

19. An ultrasonic actuator for generating a driving force comprising:
an actuator body having a piezoelectric element and generating a driving force by vibration;
a case containing the actuator body; and
at least two support members placed between the actuator body and the case to elastically support the actuator body at both sides of the actuator body in a supporting direction, wherein
the two support members are integrated with each other by a connecting member, with the connecting member being separable from the case.

20. The ultrasonic actuator of claim 19, further comprising:
a bias member placed between the actuator body and the case to bias the actuator body toward a drive target to which the drive force is applied and
the two support members are integrated with the bias member by the connecting member.

21. The ultrasonic actuator of claim 19, wherein
the connecting member is less hard than the support members.

22. The ultrasonic actuator of claim 19, wherein
the support members are made of rubber and
the connecting member is made of rubber which is less hard than the support members.

23. The ultrasonic actuator of claim 19, wherein
the support members protrude further toward the actuator body than the connecting member and
the connecting member is not in contact with the actuator body.

* * * * *